United States Patent
Sakamaki et al.

(10) Patent No.: US 7,328,117 B2
(45) Date of Patent: Feb. 5, 2008

(54) APPARATUS, METHOD AND PROGRAM FOR VERIFYING ASYNCHRONOUS CIRCUIT

(75) Inventors: Sumio Sakamaki, Kanagawa (JP); Tsuyoshi Inagawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/505,284

(22) Filed: Aug. 17, 2006

(65) Prior Publication Data
US 2007/0040586 A1    Feb. 22, 2007

(30) Foreign Application Priority Data
Aug. 18, 2005  (JP)  .............................. 2005-237372

(51) Int. Cl.
*G06F 19/00*  (2006.01)

(52) U.S. Cl. ........................... 702/117; 702/119; 703/13
(58) Field of Classification Search .................. 702/79, 702/117, 119; 703/13, 14; 716/4, 5, 6
See application file for complete search history.

(56) References Cited

U.S. PATENT DOCUMENTS 5,826,061 A * 10/1998 Walp .............................. 716/6
7,139,988 B2 * 11/2006 Chard et al. ................... 716/4

FOREIGN PATENT DOCUMENTS

JP        2003-233638 A    8/2003

* cited by examiner

*Primary Examiner*—Bryan Bui
(74) *Attorney, Agent, or Firm*—Foley & Lardner LLP (57) ABSTRACT

A computer program product for verifying an asynchronous circuit, embodied on a computer-readable medium and including code that, when executed, causes a computer to perform the following steps of (a) and (b). The step (a) includes the step of carrying out a function simulation of an asynchronous circuit based on circuit information of the asynchronous circuit including a sequential circuit stored in a storage device. The step (b) includes the step of monitoring an output value from an output node of the sequential circuit every unit time, and setting the output value in n time as a value of a metastable state, when the output vale in the n time is changed from the output value in (n−1) time.

12 Claims, 10 Drawing Sheets

```
regQ1, Q2, Q3;
always@(posedge clk1)
    Q1<=alu(aluin,Q1);

always @(posedge clk2)
begin
    Q2<=Q1;
    Q3<=Q1;
end
```

Fig. 10

```
regQ1, Q2, Q3;
regQ1_t1, Q1_t2;
always@(posedge clk1)
    Q1<=alu(aluin,Q1);
always @(posedge clk2)
begin
    Q1_t1=Q1;
    Q1_t2=Q1;
    Q2<=Q1_t1;
    Q3<=Q1_t2;
end
```

Fig. 11

APPARATUS, METHOD AND PROGRAM FOR VERIFYING ASYNCHRONOUS CIRCUIT

BACKGROUND OF THE INVENTION

1. Field of the Invention

The present invention relates to an apparatus, a method and a program for verifying an asynchronous circuit. More particularly, the present invention relates to an apparatus, a method and a program for verifying an asynchronous circuit, which execute function simulations at a language level for verifying the asynchronous circuit.

2. Description of the Related Art

The recent advancement of a semiconductor technology has been outstanding. For example, with an advancement of ultra-fine structure, a size of a circuit installed in a semiconductor chip has been increasing. This size increasing leads to increase processing time for a function simulation, when a computer executes a circuit design. In the function simulation, when an asynchronous circuit is included in a simulation target, an asynchronous input signal, whose cycle should be variable, is supplied to a function simulator. That results in further increase of the processing time.

As a solution to this problem, a conventional technique of Japanese Laid Open Patent Application (JP-P 2003-233638A) discloses a method for verifying an asynchronous circuit and its program. This method of verifying the asynchronous circuit verifies the asynchronous circuit constituted by sequential circuits which are verification targets by using a function simulation apparatus of a language level. This is characterized in that: transiently storing an input data for each event occurring time in one clock cycle for inner array elements preliminarily provided in the sequential circuits to hold values of the input data correspondingly to a plurality of times; when an active edge of a clock signal is detected, if the input data is changed from a value in a time previous of the active edge detection, defining this state as a metastable state; generating and outputting a value of the metastable state, and outputting the input data of any one time among the input data transiently stored for each event generation time, after a next one time.

Figure 1:
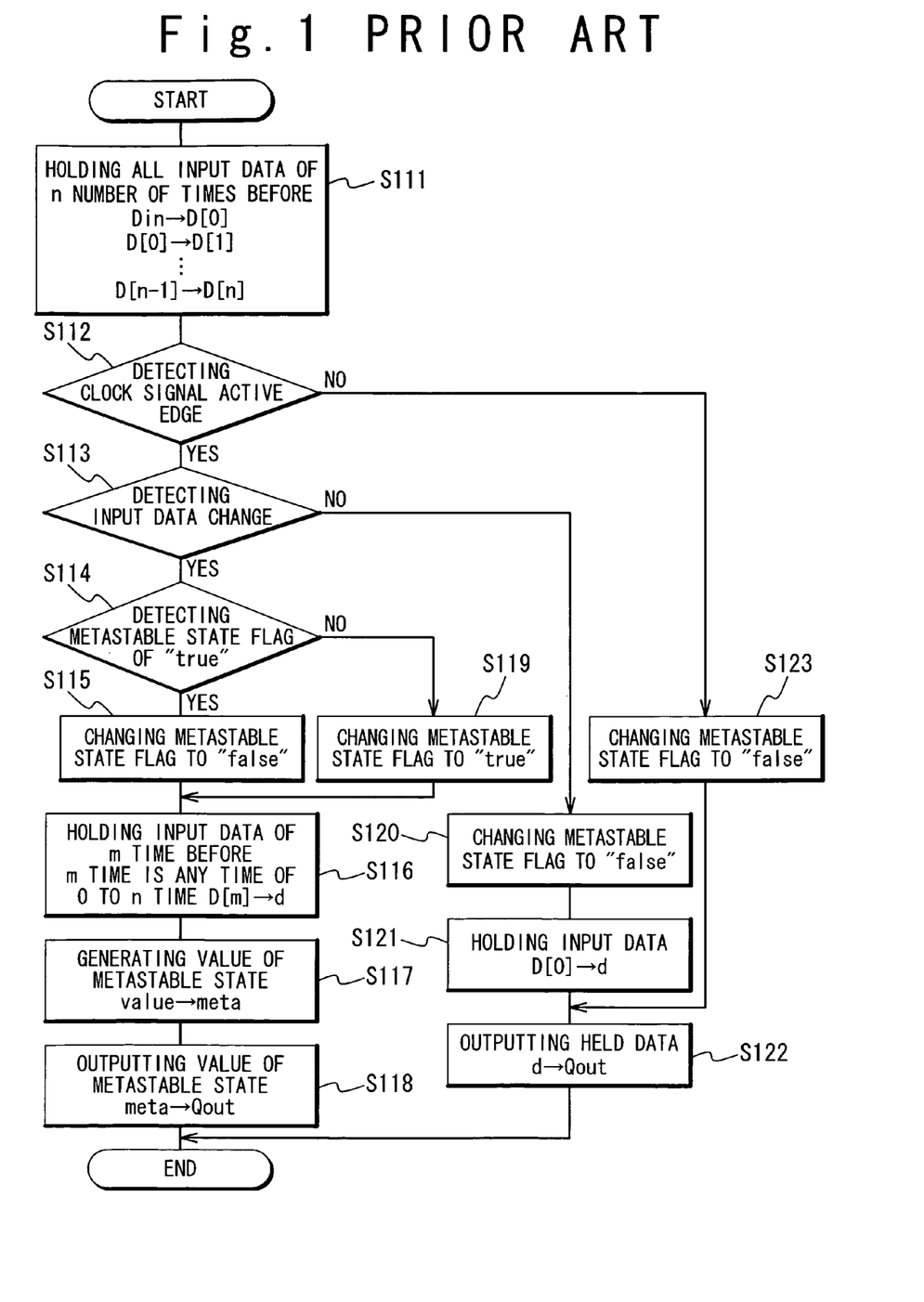
FIG. 1 is a flowchart showing the method for verifying the asynchronous circuit in the conventional technique.

Japanese Laid Open Patent Application (JP-P 2003-233638A) will be described in detail below. FIG. 1 is a flowchart showing the method for verifying the asynchronous circuit in the conventional technique. FIG. 1 shows an operation flow of a function simulation for sequential circuits, operated in a computer.

At first, at S111, the sequential circuit holds a value Din of an input data at a current time in an inner array element D[0]. Here, the inner array element is the array element possessed by each of flip-flop (hereinafter referred to as FF) 1, FF2 and FF3 of the sequential circuits. The inner array element holds the value of the input data Din in each FF, correspondingly to n number of times. The inner array element D has n number of array elements. The symbol n is assumed to be a value smaller than the number of events in one clock cycle used in the function simulation. The inner array element holds the input data value as follows. That is, in the inner array element, as time advances, the value is sequentially shifted such that the value of D[0] is shifted to D[1] and the value of D[n−1] is shifted to D[n]. Thus, the inner array element holds the values D[0] to D[n] correspondingly to the n number of times.

Next, in a clock signal active edge detecting process at S112, an edge detection of the clock signal supplied to the sequential circuit is carried out. If an edge is detected (S112: Yes), an input data change detecting process at S113 is carried out. If the edge is not detected (S112: No), the processes of S123 and S122 are carried out.

In the input data change detecting process at S113, the change detection in the input data supplied to the sequential circuit is carried out. If the change is detected (S113: Yes), a metastable state detecting process at S114 is carried out. If the change is not detected (S113: No), the processes at S120, S121 and S122 are carried out.

In the metastable state detecting process at S114, a value of a metastable state flag is checked. If the value of the metastable state flag is "true"=it is in the metastable state (S114: Yes), the metastable state flag is set to "false" at S115. After that, at S116, as the input data to the sequential circuit, the value of any element m of the inner array element D[m] (0≦m≦n) held at the foregoing S111 is held in a storage variable d. In succession, at S117, the value in the metastable state is generated by using a random number, and the generated value is held as a variable meta. Finally at S118, the value of the metastable state of the variable meta is outputted to an output Qout of the sequential circuit. Also, if the value of the metastable state flag is not "false"=it is not in the metastable state (S114: No), the metastable state flag is set to "true" at S119. Then, the processes at S116, 5117 and S118 similar to the above-mentioned explanation are performed in turn.

However, the metastable state implies that the output signal becomes unstable (metastable) because a setup time or a hold time does not meets the requirement of the input signal of a latch or flip-flop (FF). When an external asynchronous signal is synchronized in the flip-flop, a time when the input signal is changed is not identified. Thus, it is difficult to avoid the occurrence of the metastable state. However, if a situation of the occurrence of the metastable state can be checked, it is possible to design the configuration of the circuit where there is no problem even though the metastable state may occur. Here, the value of the metastable state is exemplified as a random number, any fixed value, a pseudo random number based on a certain initial value, and the like.

In the processes at S120, S123, the value of the metastable state flag is set to the value showing that it is not in the metastable state="false", similarly to the foregoing S115. In the process at S121, the value of the input data Din to the sequential circuit is hold in the variable d, similarly to the foregoing S116. In the process at S122, the value held in the variable d is outputted to the output Qout of the sequential circuit. Consequently, in the process at S116 after the metastable state detecting process at S114, the operation for holding the input data different from each other, between the sequential circuits where the same data signals triggered by the same clock signal are used as the input data. In addition, in the series of the processes at S117 and S118, the operation for outputting the value of the metastable state can be carried out in the event that the value of the input data is changed from the value of the previous time when the clock signal is active.

Also, in the series of the processes at S120, S121 and S122 after the input data change detecting process at S113, the operation can be carried out in the case that the value of the input data is not changed from the value of the previous time when the clock signal is active. In addition, in the series of the processes at S123, S122 after the clock signal active edge detecting process at S112, the operation can be carried out when the clock signal is inactive. Thus, after the value of the metastable state is outputted, it is possible to carry out the operation for outputting the held input data from the inner array element after a next one time.

Figure 2:
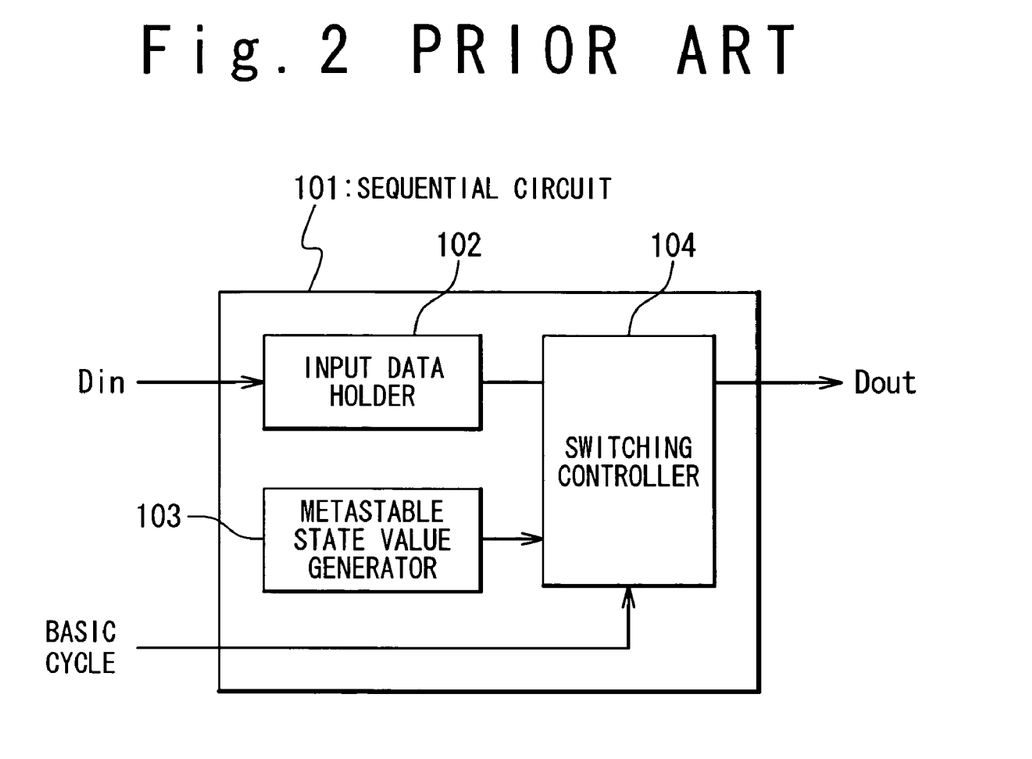
FIG. 2 is a view showing a conventional configuration of a function block to carry out the operation flow of FIG. 1.

FIG. 2 is a view showing a conventional configuration of a function block to carry out the operation flow of FIG. 1. A sequential circuit 101 simulates the usual FF operation, correspondingly to the sequential circuits FF1 to FF3. The sequential circuit 101 includes an input data holder 102, a metastable state value generator 103 and a switching controller 104. The input data holder 102 holds the input data Din. The metastable state value generator 103 generates the metastable state value. The switching controller 104 determines an output Dout of the sequential circuit, in accordance with the function simulation operation flow of FIG. 1, at a basic cycle unit, on the basis of the held input data and the generated metastable state value. Here, the basic cycle is equal to or less than one cycle of the clock.

A case of applying the function simulation operation flow of FIG. 1 to a certain asynchronous circuit will be described below.

Figure 3:
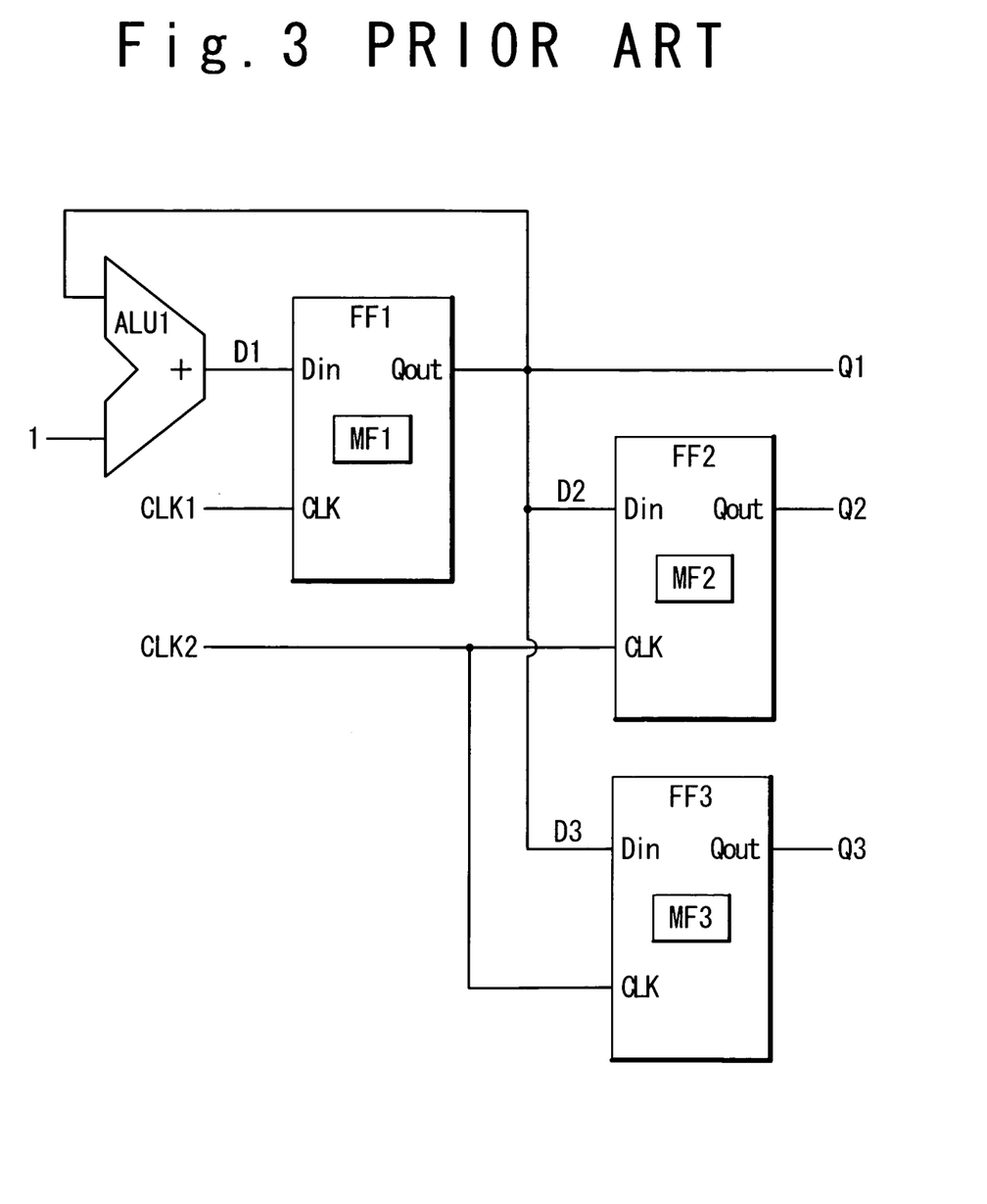
FIG. 3 is a circuit diagram showing an example of the asynchronous circuit to which the function simulation operation flow is applied.

FIG. 3 is a circuit diagram showing an example of the asynchronous circuit to which the function simulation operation flow is applied. This asynchronous circuit includes FF1, FF2 and FF3 as the sequential circuits, and an adder ALU1. An input data D1 of FF1 is a value after +1 is added to an output data Q1 of FF1 by the adder ALU1. An input data D2 of FF2 and an input data D3 of FF3 are an output data Q1 of FF1. A clock signal CLK1 is sent to FF1. A clock signal CLK2 is sent to FF2 and FF3. That is, the input signal of FF1 is the clock signal CLK1 and the input data D1, and its output signal is the output data Q1. The input signal of FF2 is the clock signal CLK2 and an input data D2 (=Q1), and its output signal is an output data Q2. The input signal of FF3 is the clock signal CLK2 and an input data D3 (=Q1), and its output signal is an output data Q3. Also, a metastable state flag MF1 of FF1, a metastable state flag MF2 of FF2 and a metastable state flag MF3 of FF3 are defined.

Figure 4:
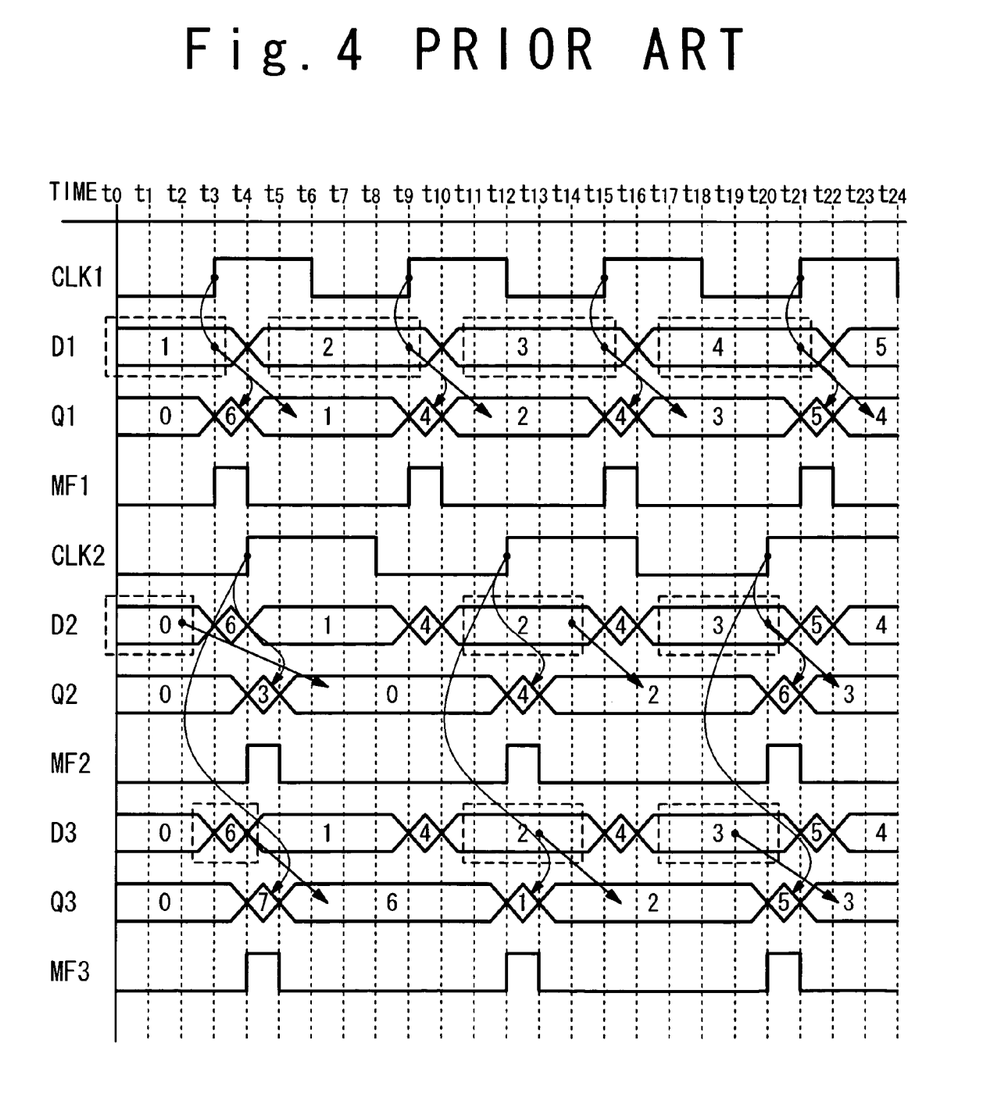
FIG. 4 is a timing chart showing states of each signal in the function simulation operation flow.

FIG. 4 is a timing chart showing states of each signal in the function simulation operation flow. The lateral axis indicates a time. Here, CLK1, D1, Q1, and MF1 are mainly related to FF1. CLK2, D2, Q2, and MF2 are mainly related to FF2. CLK2, D3, Q3, and MF3 are mainly related to FF3. As shown in FIG. 4, the clock signal CLK1 is assumed to be changed for each 3 number of times, and the clock signal CLK2 is assumed to be changed for each 4 number of times.

At first, in the sequential circuit FF1, the value, in which +1 is added to the output Q1 (=0) of Qout of FF1 by the adder ALU1, is supplied as the input data D1 (=1). Then, the values in the 3 number of times, in short, the value (=1) at the time t0, the value (=1) at the time t1 and the value (=1) at the time t2 are held in the inner array element (S111). Next, at the time t3, a rising edge of CLK1 is active (S112: Yes), and the value (=1) of D1 is changed from the value of the previous time (namely, the value (=0) of the initial state of FF1) (S113: Yes). Here, in the initial state, MF1 is "false" (=0) (S114: No). Thus, the value of the metastable state flag MF1 of FF1 at the time t3 becomes "true" (=1) (S119). Then, the value (for example, =1) at any time (for example, =time t2) in the inner array element of FF1 is selected as a usual value d (S116). After that, the value meta (=6) of the metastable state is generated (S117), and the value (=6) of the metastable state is outputted from Qout to Q1 (S118).

In succession, at the time t4, the rising edge of CLK1 becomes inactive (S112: No). Thus, the value of the metastable state flag MF1 of FF1 becomes "false" (−0) (S123). After that, the value at any time selected in the inner array element of FF1, namely, the usual value d (=1) is outputted as the output Q1 (S122).

Similarly, at the times t9, t10, the times t15, t16 and the times t21, 22, in one clock cycle, the value of the metastable state flag MF1 becomes "true" (=1) (S119). Then, at the output Q1 of Qout, the values (respectively, 4, 4 and 5) of the metastable states are outputted (S118). After that, the value at any one time between the 3 number of times held in the inner array element (=d) is outputted as the usual value (S122).

Next, the sequential circuit FF2 receives the input data D2 having the same value as the output Q1 of FF1. Then, similarly to FF1, the values between the 3 number of times of the input data D2, in short, the value (=0) at the time t1, the value (=0) at the time t2 and the value (=6) at the time t3 are held in the inner array element (S111). Next, at the time t4, a rising edge of CLK2 is active (S112: Yes), and the value (=6) of D2 is changed from the value of the previous time (namely, the value (=0) of the initial state of FF2) (S113: Yes). Here, in the initial state, MF2 is "false" (=0) (S114: No). Thus, the value of the metastable state flag MF2 of FF2 at the time t4 is "true" (=1) (S119). Then, the value (for example, =0) at any time (for example, =time t1) in the inner array element of FF2 is selected as the usual value d (S116). After that, the value meta (=3) of the metastable state is generated (S117), and the value (=3) of the metastable state is outputted from Qout to Q2 (S118).

In succession, at the time t5, the rising edge of CLK3 becomes inactive (S112: No). Thus, the value of the metastable state flag MF2 of FF2 becomes "false" (=0) (S123). After that, the value at any time selected in the inner array element of FF2, namely, the usual value d (=0) is outputted as the output Q2 (S122).

At the times t12, t13 and the times t20, t21, when the rising edge of CLK2 is active (S112: Yes), there is no change in the value of D2 (S113: No) Thus, in one clock cycle, the value of the metastable state flag MF2 becomes "false" (=0) (S120), and at the output Q2 of Qout, the value of the finally held time (t11/t19) in the 3 number of times (t9, t10, t11/t17, t18, t19) held (S121) in the inner array element is outputted as the usual value d (S122).

Next, the sequential circuit FF3 receives the input data D3 having the same value as the output Q1 of FF1. Then, similarly to FF1, the values between the 3 number of times of the input data D3, in short, the value (=0) at the time t1, the value (=0) at the time t2 and the value (=6) at the time t3 are held in the inner array element (S111). Next, at the time t4, the rising edge of CLK2 is active (S112: Yes), and the value (=6) of D3 is changed from the value of the previous time (namely, the value (=0) of the initial state of FF3) (S113: Yes). Here, in the initial state, MF3 is "false" (=0) (S114: No). Thus, the value of the metastable state flag MF3 of FF3 at the time t4 is "true" (=1) (S119). Then, the value (for example, =6) at any time (for example, =time t3) in the inner array element of FF3 is selected as the usual value d (S116). After that, the value meta (=7) of the metastable state is generated (S117), and the value (=7) of the metastable state is outputted from Qout to Q3 (S118).

In succession, at the time t5, the rising edge of CLK2 becomes inactive (S112: No). Thus, the value of the metastable state flag MF3 of FF3 becomes "false" (=0) (S123). After that, the value at any time selected in the inner array element of FF3, namely, the usual value d (=6) is outputted as the output Q3 (S122).

At the times t12, t13 and the times t20, t21, when the rising edge of CLK2 is active (S112: Yes), there is no change in the value of D3 (S113: No). Thus, in one clock cycle, the value of the metastable state flag MF3 becomes "false" (=0) (S120), and at the output Q3 of Qout, the value of the finally held time (t11/t19) in the 3 number of times (t9, t10, t11/t17, t18, t19) held (S121) in the inner array element is outputted as the usual value d (S122).

Here, the sequential circuits FF2, FF3 at the time t4 capture the values of the output Q1 of FF1, which are the same data signal, through the rising edge of CLK2 as the input data D2, D3. However, the values selected at any time from the inner array element held as the values in the 3 number of times, respectively, are the different values, such as the value (=0) of the time t1 at FF2 and the value (=6) of the time t3 at FF3. Thus, this indicates the occurrence of the phenomenon that the values held between the sequential circuits FF2, FF3 are different.

This fact indicates that at the timing of the time t4, when a time difference between a signal transmission delay of the input data D2 to FF2 and a signal transmission delay of the input data D3 to FF3 is simulated, the same data signal triggered by the same clock signal involves a trouble operation caused by a timing problem between the input sequential circuits.

Also, the value (=6) of the D3 selected as the usual value by FF3 is the value of the metastable state generated in the sequential circuit FF1. Thus, this implies that the originally expected input data, namely, the value different from the value (=1) of the output Q1 at the time t4 is inputted to FF3. Thus, from the time t5 to the time t12, this asynchronous circuit results in the trouble operation. The change of CLK1 at the time t3 and the change of CLK2 at the time t4 indicate the timings when the trouble operation occurs in this asynchronous circuit.

As mentioned above, the method of verifying the asynchronous circuit in Japanese Laid Open Patent Application (JP-P 2003-233638A) discloses the operation of the circuit configuration where the output data of the plurality of sequential circuits, in which the cycles of the clock signals are different, mutually serve as the input data of the sequential circuits.

The foregoing conventional method of verifying the asynchronous circuit determines the output values of the sequential circuits, in accordance with the function simulation operation flow (conventional algorithm), on the basis of the input data to the sequential circuit FF and the value of the metastable state, in one basic cycle unit of the function simulation. That is, a reset signal that can be supplied to the sequential circuit FF is not considered. For this reason, this verifying method does not change the output value for the sequential circuit including the asynchronous reset signal. Thus, it is difficult to properly execute the function simulation of the sequential circuit while considering the asynchronous reset signal. A technique that can properly execute the function simulation of the sequential circuit regardless of the reset signal and the clock signal is desired.

The conventional method of verifying the asynchronous circuit requires the inner array elements D[0] to D[n] to hold the input data before the n number of times, and they are required for each sequential circuit having the different cycle of the clock signal. For this reason, as the circuit size of the verification target becomes bigger, the memory amount consumed for the inner array elements when the circuit simulation is executed becomes greater. Usually, there is the limit in the memory resource of the computer for executing the function simulation. For this reason, its amount limit leads to the restriction on the circuit size to which the conventional technique can be applied. A technique that can execute the circuit simulation in which the memory use amount is suppressed is desired.

SUMMARY OF THE INVENTION

In order to achieve an aspect of the present invention, the present invention provides a computer program product for verifying an asynchronous circuit, embodied on a computer-readable medium and including code that, when executed, causes a computer to perform the following: (a) carrying out a function simulation of an asynchronous circuit based on circuit information of the asynchronous circuit including a sequential circuit stored in a storage device; and (b) monitoring an output value from an output node of the sequential circuit every unit time, and setting the output value in n time as a value of a metastable state, when the output vale in the n time is changed from the output value in (n−1) time.

In the present invention, the output value is monitored, and just after the output vale of the output node of the sequential circuit is changed, the output value is set to the value of the metastable state. This leads to be able to carry out the function simulation in the metastable state regardless of the reset signal and clock signal and so on. As a result, regardless of the configuration difference among the sequential circuits such as the existence or nonexistence of the reset signal, the function simulation can be properly executed. Further, it is unnecessary to have the inner array elements D[0] to D[n] for holding the output value of n number of times. Therefore, the circuit simulation can be carried out suppressing the memory consumption amount.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those t skilled in the art will recognize that many alternative embodiments can be accomplished using the teachings of the present invention and that the invention is not limited to the embodiments illustrated for explanatory purposed.

Embodiments of an apparatus, a method and a program for verifying an asynchronous circuit according to the present invention will be described below with reference to the attached drawings.

Figure 5:
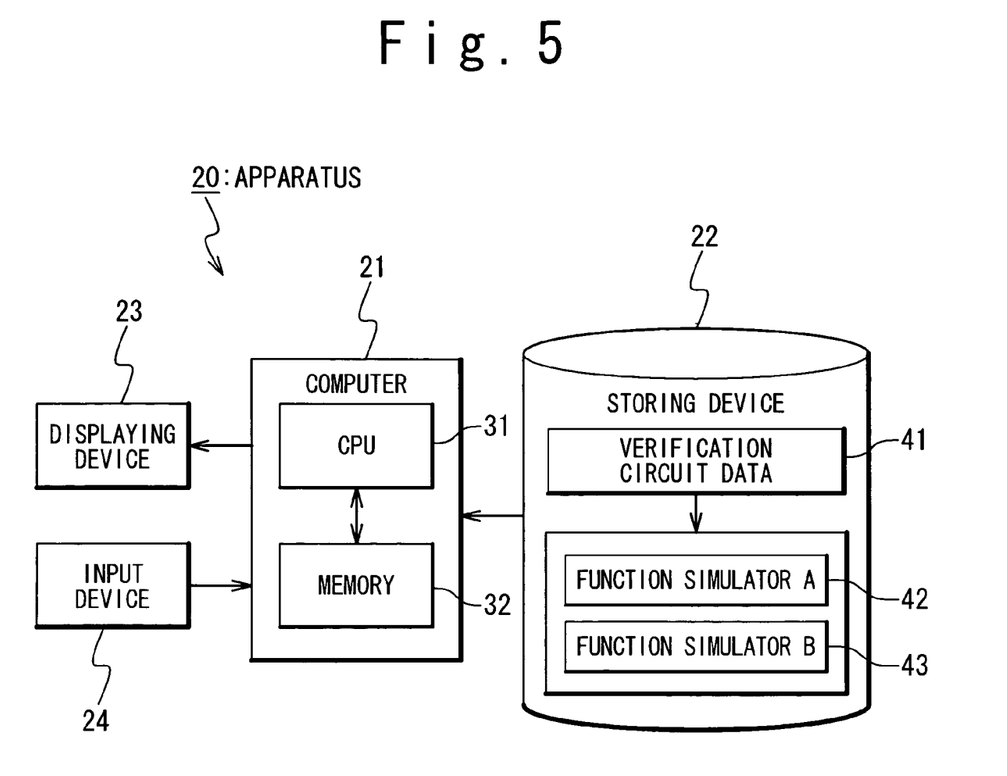
FIG. 5 is a block diagram showing the configuration of the apparatus for verifying the asynchronous circuit in the embodiment according to the present invention.

At first, the embodiment of the configuration of the apparatus for verifying the asynchronous circuit according to the present invention will be described. FIG. 5 is a block diagram showing the configuration of the apparatus for verifying the asynchronous circuit in the embodiment according to the present invention. An apparatus 20 for verifying an asynchronous circuit includes a computer 21, a storing device 22, a displaying device 23 and an input device 24. The computer 21 is an information processor exemplified as a work station and a personal computer. The computer 21 includes a CPU 31 and a memory 32 and transmits and receives the information (data) to and from the storing device 22, the displaying device 23 and the input device 24. The storing device 22 includes verification circuit data 41 indicating circuits to be verified (to be simulated), a function simulator A 42 including an existing function simulator, and a function simulator B 43 including a function simulator according to the present invention. The verification circuit data 41, the function simulator A 42 and the function simulator B 43 are, for example, loaded in the memory 32 and executed by the CPU 31.

Figure 6:
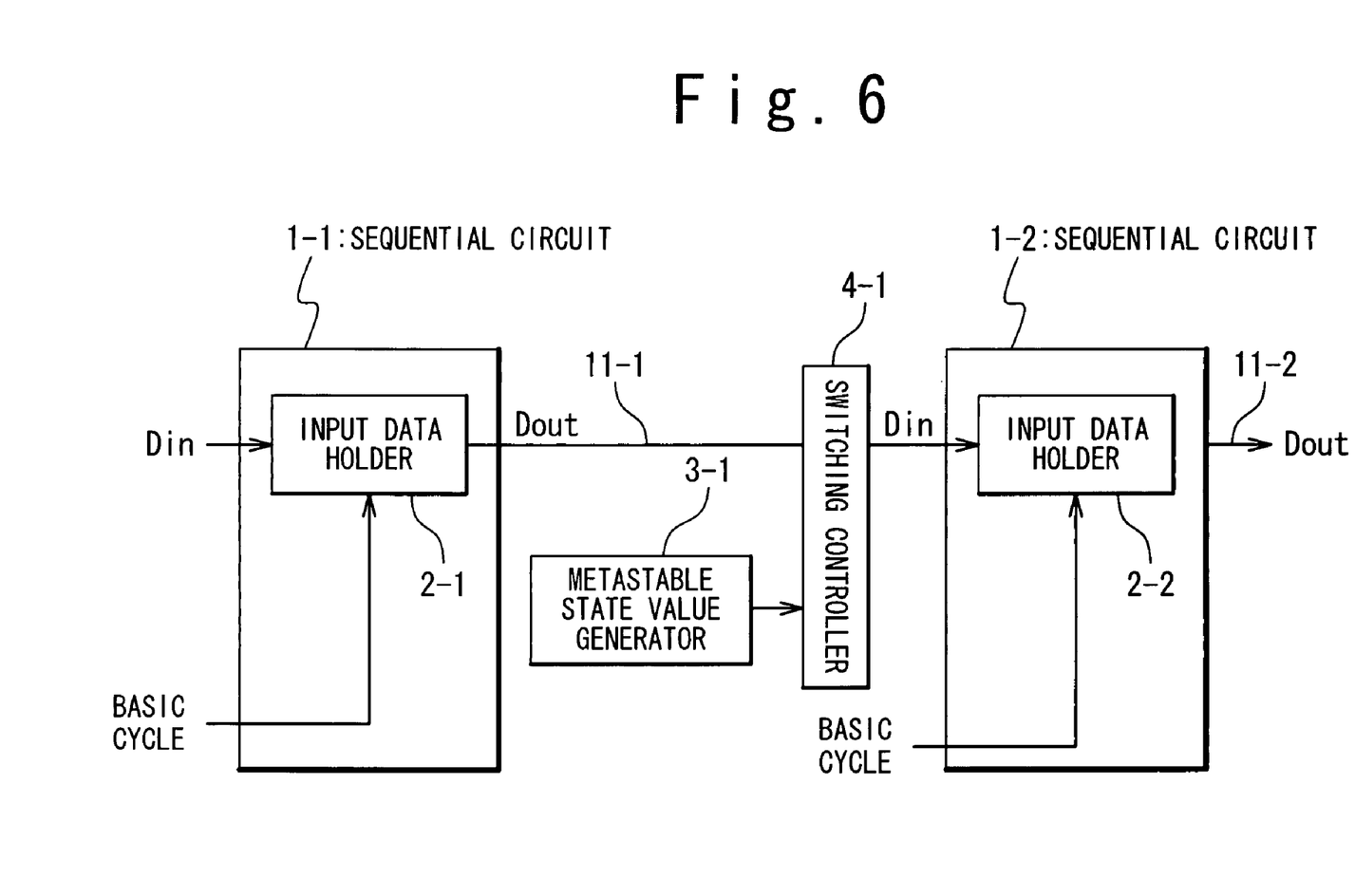
FIG. 6 is a function block diagram showing the configuration of the apparatus for verifying the asynchronous circuit in the embodiment according to the present invention.

FIG. 6 is a function block diagram showing the configuration of the apparatus for verifying the asynchronous circuit in the embodiment according to the present invention. The apparatus for verifying the asynchronous circuit includes: sequential circuits 1-1, 1-2 to (1-$n$) ($n$ is an integer of 2 or more); switching controllers 4-1, 4-2 to (4-(n−1)) and metastable state value generators 3-1, 3-2 to (3-(n−1)).

The sequential circuits 1-1, 1-2 to (1-$n$) correspond to the sequential circuits FF1, FF2 to FFn and simulate the usual FF operations. The sequential circuits 1-1, 1-2 to (1-$n$) include input data holders 2-1, 2-2 to (2-$n$), respectively. The input data holders 2-1, 2-2 to (2-$n$) hold the input data Din. An output from the sequential circuit 1-$i$ ($i$ is an integer of $1 \leq i \leq (n-1)$) at the former stage and an input to the sequential circuit 1-(i+1) at the latter stage are connected through nets (hereafter, referred to as connection node) 11-1, 11-2 to (11-(n−1).

Each of the switching controllers 4-1, 4-2 to (4-(n−1)) is installed in the course of the connection node 11 between the sequential circuits 1 adjacent to each other. For example, the switching controller 4-1 is installed in the course of the connection node 11-1 between the sequential circuit 1-1 and the sequential circuit 1-2. The value of the input data Din of the connection node 11 is monitored. Then, if the value is changed, the value is replaced by the metastable state value in one basic cycle time. If the value is not changed, the value itself is defined as the input data. The metastable state value generators 3-1, 3-2 to (3-(n−1)) generate and supply the metastable state values to the switching controllers 4-1, 4-2 to (4-(n−1)), respectively.

The sequential circuits 1-1, 1-2 to (1-$n$) and the connection nodes 11-1, 11-2 to (11-(n−1)) correspond to the function simulator A 42. The function simulator A 42 simulates the circuit operation of the circuit (the verification circuit data 41) of a verification target. The switching controllers 4-1, 4-2 to (4-(n−1)) and the metastable state value generators 3-1, 3-2 to (3-(n−1)) correspond to the function simulator B 43 of the present invention.

Figure 7:
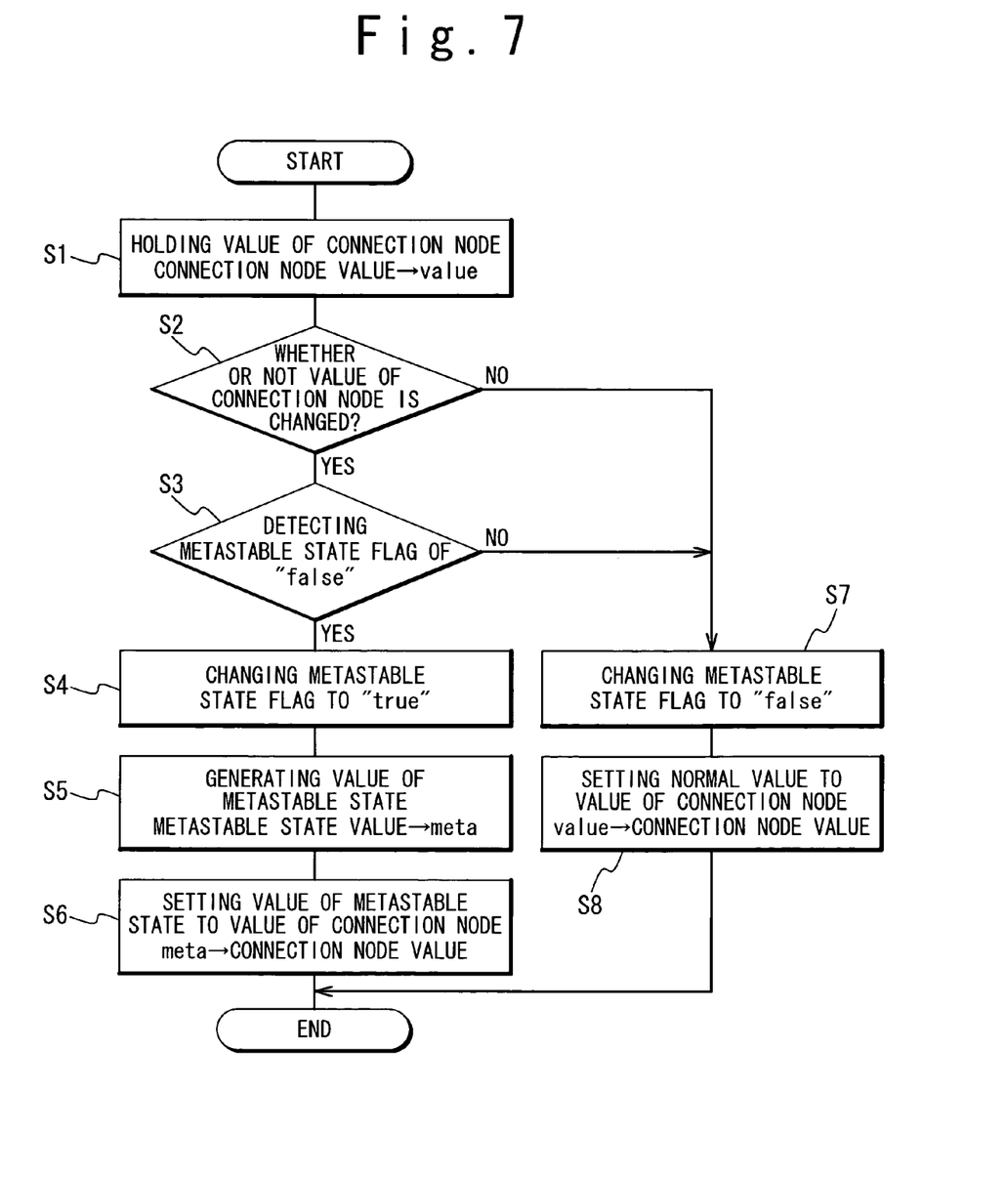
FIG. 7 is a flowchart showing the method (the program) for verifying the asynchronous circuit in the embodiment according to the present invention.

The method (the program) for verifying the asynchronous circuit in the embodiment according to the present invention will be described below. FIG. 7 is a flowchart showing the method (the program) for verifying the asynchronous circuit in the embodiment according to the present invention. FIG. 7 shows the function simulation operation flow of the asynchronous circuit. Here, the sequential circuits 1-1, 1-2, the switching controller 4-1, the metastable state value generator 3-1 and the connection node 11-1 in FIG. 6 are exemplified and explained.

At first, at S1, the switching controller 4-1 holds the value of the connection node 11-1 outputted from the sequential circuit 1-1 as "Value". Next, at S2, the switching controller 4-1 judges whether or not the value of the connection node 11-1 is changed. If the value of the connection node 11-1 is changed (S2: Yes), the switching controller 4-1 carries out a metastable state detecting process at S3. If the value of the connection node 11-1 is not changed (S2: No), the switching controller 4-1 carries out the processes at S7, S8.

In the metastable state detecting process at S3, the switching controller 4-1 checks the value of a metastable state flag. If the value of the metastable state flag is "false"=it is not in the metastable state (S3; Yes), then, at S4, the switching controller 4-1 sets the metastable state flag (sets to "true"). Incidentally, in the initial state, the value of the metastable state flag is "false". If the value of the metastable state flag is "true"=it is in the metastable state (S3: No), the switching controller 4-1 carries out the processes at S7, S8.

After that, at S5, the metastable state generator 3-1 generates the value of the metastable state by using a random number, and holds its value as a variable meta. At S6, the switching controller 4-1 sets the variable meta of the value of the metastable state to the value of the connection node 11-1. Then, the switching controller 4-1 outputs to the input of the sequential circuit 1-2.

If the value of the connection node 11-1 is not changed (S2: No), or if the value of the metastable state flag is "true"=it is in the metastable state (S3: No), then, at S7, the switching controller 4-1 clears the flag showing the metastable state (sets to "false"). Then, at S8, the switching controller 4-1 sets the value of the connection node 11-1, which is held as "Value" at S3, in its original state to the value of the connection node 11-1. Then, the switching controller 4-1 outputs the value to the input of the sequential circuit 1-2.

Figure 8:
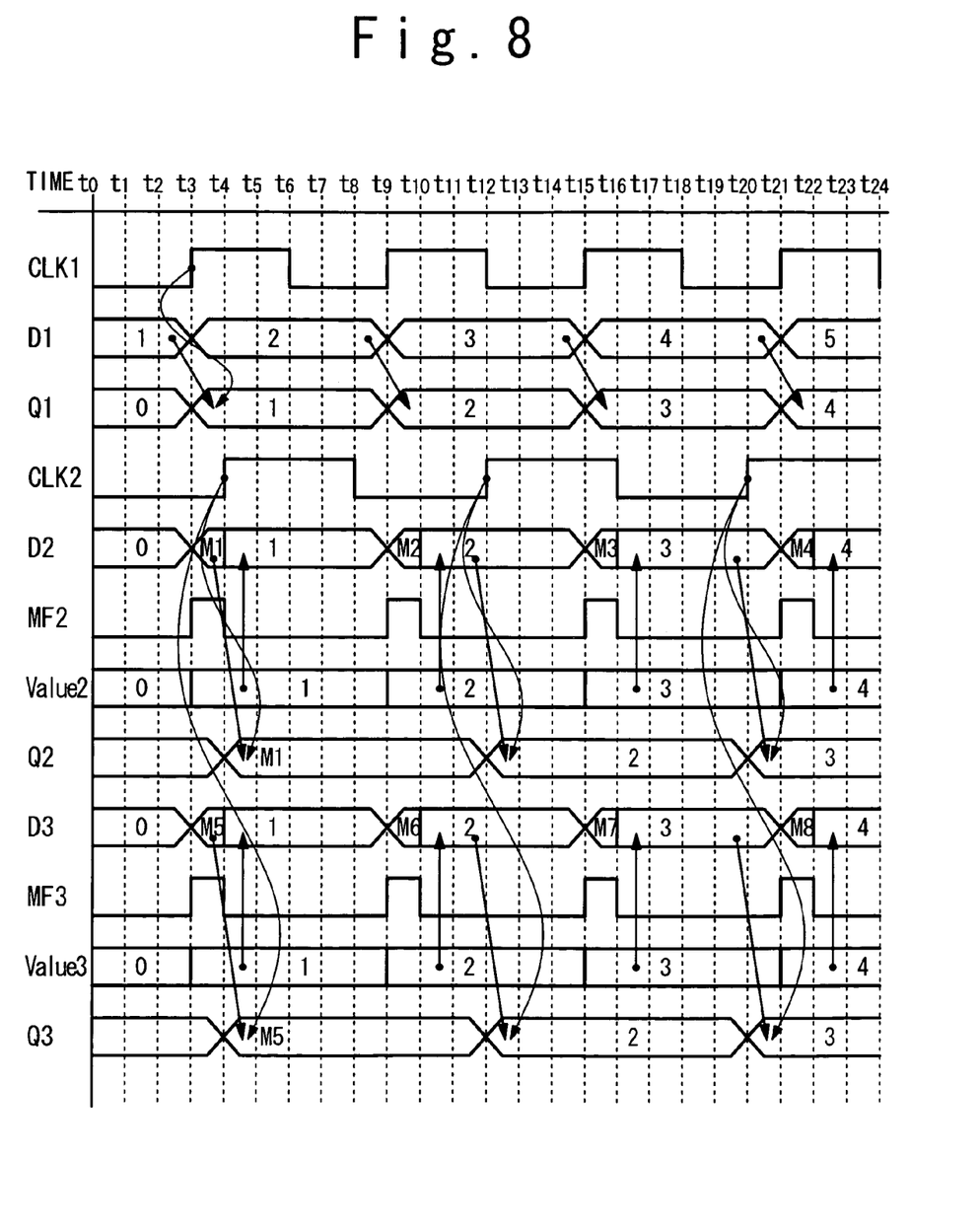
FIG. 8 is a timing chart showing the state of each signal in the method (the program) for verifying the asynchronous circuit in the embodiment according to the present invention.

Next, the operation of the method (the program) for verifying the asynchronous circuit in the embodiment according to the present invention will be described below with reference to the asynchronous circuit in FIG. 3 as an example. FIG. 8 is a timing chart showing the state of each signal in the method (the program) for verifying the asynchronous circuit in the embodiment according to the present invention. Its lateral axis indicates the time.

At first, the operation regarding the sequential circuit FF2 will be described below. CLK2, D2, MF2, Value 2, and Q2 are mainly related to the sequential circuit FF2.

At times t0, t1, t2 and t3, the value of the connection node D2 is updated and held to Value 2 (0→0→0→1) (S1). Then, at the time t3, if the value of the connection node D2 is changed from 0 to 1 (S2: Yes), the value of the metastable state flag MF2 of the sequential circuit FF2 is checked (S3). If the metastable state flag MF2 is "false" (S3: Yes), the metastable state flag MF2 is set to "true" (S4). Then, the value=M1 of the metastable state is generated (S5). After that, the value=M1 of the metastable state is set for the connection node D2 (S6). Then, M1 is inputted to Din of the sequential circuit FF2. Next, at a time t4, since the value of the connection node D2 is not changed (S2: No), the metastable state flag MF2 is set to "false" (S7). The value (=1) held as Value 2 is set for the connection node D2 (38). At that time, since CLK2 is changed to a rising change (active edge), the sequential circuit FF2 latches the value (=M1) of the connection node D2 (Q2=M1).

Next, the operation regarding the sequential circuit FF3 will be described below. CLK2, D3, MF3, Value 3, and Q3 are mainly related to the sequential circuit FF3.

At the times t0, t1, t2 and t3, the value of the connection node D3 is updated and held to Value 3 (0→0→0→1) (S1). Then, at the time t3, if the value of the connection node D3 is changed from 0 to 1 (S2: Yes), the value of the metastable state flag MF3 of the sequential circuit FF3 is checked (S3). If the metastable state flag MF3 is "false" (S3: Yes), the metastable state flag MF3 is set to "true" (S4). Then, the value=M5 of the metastable state is generated (S5). After that, the value=M5 of the metastable state is set for the connection node D3 (S6). Then, M5 is inputted to Din of the sequential circuit FF3. Next, at the time t4, since the value of the connection node D3 is not changed (S2: No), the metastable state flag MF3 is set to "false" (S7). The value (=1) held as Value 3 is set for the connection node D3 (S8). At that time, since CLK2 is changed to the rising change (active edge), the sequential circuit FF3 latches the value (=M5) of the connection node D3 (Q3=M5).

In this way, in the connection nodes D2 and D3 to which the values of the output Q1 of the sequential circuit FF1 are set, the different values (M1 and M5) of the metastable states are latched, respectively. Thus, it is possible to equivalently represent the difference of signal delays caused by the difference between the interconnection lengths.

According to the present invention, it is possible to correctly execute the function simulation of the plurality of sequential circuits including the asynchronous reset signal and clock signal. That is, irrespectively of the circuit configuration of the asynchronous circuit, the function simulation can be carried out, and the asynchronous circuit can be correctly verified.

Also, according to the present invention, for each connection net, it is changed so as to use the value of its net and the value of the metastable state. Thus, it does not require the inner array elements D[0] to D[n] to hold the input data n number of times before, which was required in the conventional technique. Hence, it is possible to suppress the increase in the memory consumption amount that implies the computer resource.

In the circuit diagram of the asynchronous circuit shown in FIG. 3, there is a case that the connection node of the sequential circuit FF2 and the connection node of the sequential circuit FF3 become equal. In that case, before applying the operation flow of the method (the program) for verifying the asynchronous circuit according to the present invention in FIG. 7, it is preferred to add the process for separating the connection node of the sequential circuit FF2 and the connection node of the sequential circuit FF3.

Figure 9:
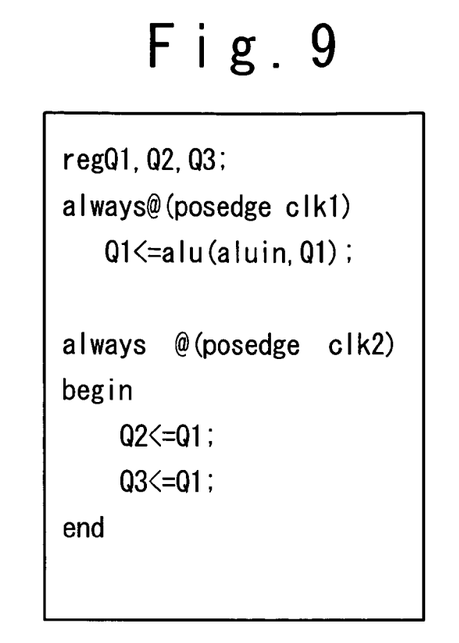
FIG. 9 is a description example of an RTL (Register Transfer Level) source where the connection node of the sequential circuit FF2 and the sequential circuit FF3 are connected to the same connection node.
Figure 10:
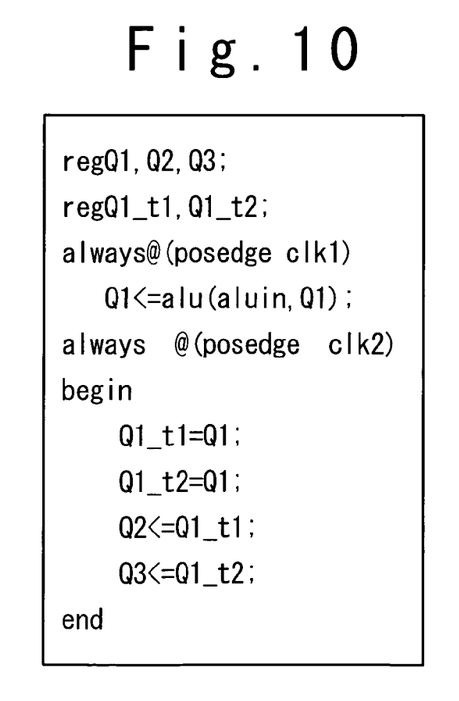
FIG. 10 is a description example of the RTL source changed so that the connection node of the sequential circuit FF2 and the connection node of the sequential circuit FF3 are independent of each other.

FIG. 9 is a description example of an RTL (Register Transfer Level) source where the connection node of the sequential circuit FF2 and the sequential circuit FF3 are connected to the same connection node. FIG. 10 is a description example of the RTL source changed so that the connection node of the sequential circuit FF2 and the connection node of the sequential circuit FF3 are independent of each other.

FIG. 9 is described such that, when the active edge of a clock signal ck12 is detected, an output signal Q1 of the sequential circuit FF1 is outputted to an output Q2 of the sequential circuit FF2 and an output Q3 of the sequential circuit FF3. On the other hand, FIG. 10 is changed such that, after the output signal Q1 of the sequential circuit FF1 is outputted to independent inner variables Q1_t1 and Q1_t2, they are outputted to the output Q2 of the sequential circuit FF2 and the output Q3 of the sequential circuit FF3, respectively.

In the method of verifying the asynchronous circuit according to the present invention in FIG. 7, even if the plurality of sequential circuits are connected to the same net (connection node), the processes are carried out within the same processing flow. For this reason, when the plurality of sequential circuits are connected to the same net, it is impossible to consider the difference of the signal delays caused by the difference between the interconnection lengths, among the plurality of sequential circuits. As the method for avoiding this, it is possible to carry out the present invention for each connection net connected to each of the sequential circuits, by separating the connection net (connection node) as shown in FIG. 10. In this case, the correlative state between the metastable state value generated from the random number and the value of the connection node before the change is equivalent to the consideration of the difference of signal delays between the sequential circuits. Thus, the expected function simulation result is obtained.

Figure 11:
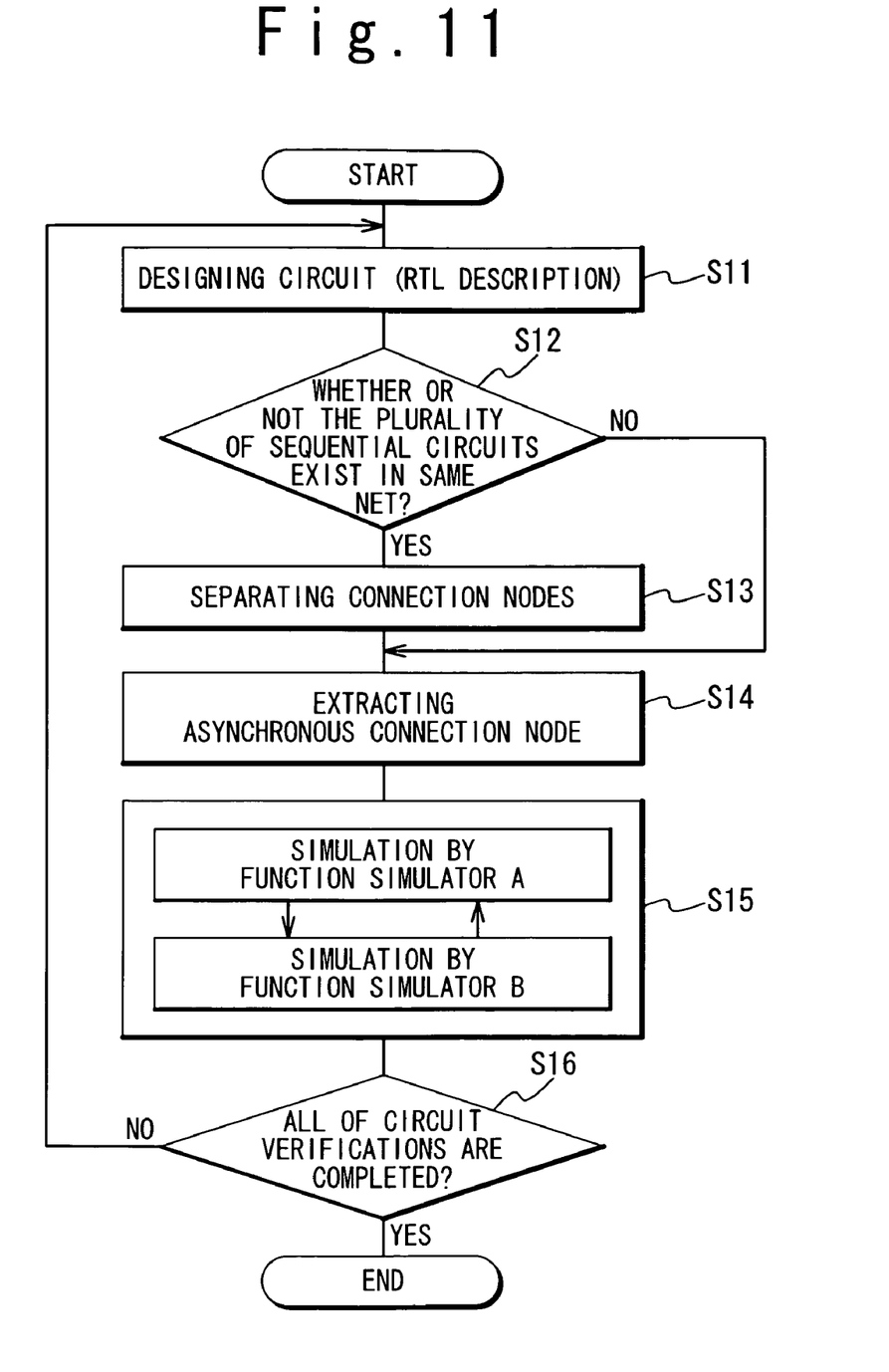
FIG. 11 is a flowchart showing a method that verifies a circuit including an asynchronous circuit in an RTL description by using the program for verifying the asynchronous circuit according to the present invention.

FIG. 5 shows the system configuration view when the method of verifying the asynchronous circuit according to the present invention is assembled into the computer system as the program. Here, an example of a case when this verifying program is used to verify the circuit including the asynchronous circuit described in the RTL will be described. FIG. 11 is a flowchart showing the method which uses the program for verifying the asynchronous circuit according to the present invention and verifies the circuit including the asynchronous circuit in the RTL description.

At first, the RTL (Resister Transfer Level) description is used to design the circuit (S11). Next, whether or not the plurality of sequential circuits exists in the same net within the designed circuit is judged (S12). If the plurality of sequential circuits exist in the same net (S112: Yes), as shown in FIG. 10, the process for separating the connection node is carried out such that the connection nodes of the respective sequential circuits are independent of each other (S13). If the plurality of sequential circuits do not exist in the same net (S12: No), the process at S13 is not carried out, and the operation flow proceeds to the process at S14. In succession, each separated connection node is checked whether or not the connection node is the asynchronous connection node. Here, the asynchronous connection node is the connection node, through which the output (data) of the sequential circuit that the cycle of the clock signal is different is connected to the next sequential circuit via the combination circuit and the like. Then, the asynchronous connection node is extracted (S14). For example, an EDA (Electronic Design Automation) tool available commercially can be used for the extraction in the process at this S14. Next, for the connection node extracted at S14, the function simulator B 43 monitors the value determined by the function simulator A 42 as mentioned above. Then, in the case that the value of the connection net is changed, the function simulator B 43 replaces the value of the connection net by the value of the metastable state in one basic cycle time. In the other cases, the function simulator B 43 uses the value itself of the connection net as the input data signal (S15). The detail of S15 is as explained in FIGS. 7 and 8. After that, until all of the circuit verifications are completed by using the above-explained method, the operation flow returns to S11, and the processes are repeatedly executed (S16).

By using the program for verifying the asynchronous circuit according to the present invention as mentioned above, it is possible to correctively verify the asynchronous circuit as mentioned above, irrespectively of the circuit configuration, and also suppress the increase in the memory consumption amount.

According to the present invention, it is possible to suitably execute the simulation by suppressing the memory use amount without any consideration of the difference between the sequential circuit configurations.

It is apparent that the present invention is not limited to the above embodiment, which may be modified and changed without departing from the scope and spirit of the invention.

What is claimed is:

1. A computer program product for verifying an asynchronous circuit, embodied on a computer-readable medium and comprising code that, when executed, causes a computer to perform the following:
   (a) carrying out a function simulation of an asynchronous circuit based on circuit information of said asynchronous circuit including a sequential circuit stored in a storage device; and
   (b) monitoring an output value from an output node of said sequential circuit every unit time, and setting said output value in n time as a value of a metastable state, when said output value in said n time is changed from said output value in (n−1) time;
   wherein said step (a) includes:
   (a1) when said asynchronous circuit includes a plurality of sequential circuits which are connected to a same net, separating said net for each of said plurality of sequential circuits, and
   (a2) carrying out said function simulation of a first asynchronous circuit including a separated sequential circuit, which is included in said plurality of sequential circuits and connected to said separated net,
   wherein said step (b) includes:
   (b1) monitoring said output value from said output node of said separated sequential circuit every unit time, and setting said output value of said separated sequential circuit in said n time as said value of the metastable state, when said output value of said separated sequential circuit in said n time is changed from said output value in said (n−1) time.

2. The computer program product according to claim 1, wherein said asynchronous circuit includes:
   a first sequential circuit, and
   a second sequential circuit configured to be asynchronous to said first sequential circuit,
   wherein a first output node of said first sequential circuit is connected to an input node of said second sequential circuit,
   wherein said step (b) includes:
   (b2) outputting said first output value to said second sequential circuit.

3. The computer program product according to claim 1, wherein said step (a2) includes:
   (a21) extracting a circuit as said first asynchronous circuit, wherein said circuit has a node through which an output of asynchronous sequential circuit is connected to a next sequential circuit.

4. The computer program product according to claim 1, wherein said plurality of sequential circuits further includes:
   a first sequential circuit configured to be asynchronous to said separated sequential circuit, wherein a first output node of said first sequential circuit is connected to an input node of said separated sequential circuit,
   wherein said step (b) includes:
   (b3) outputting said first output value to said separated sequential circuit.

5. A method for verifying an asynchronous circuit, comprising:
   (a) carrying out a function simulation of an asynchronous circuit based on circuit information of said asynchronous circuit including a sequential circuit stored in a storage device; and
   (b) monitoring an output value from an output node of said sequential circuit every unit time, and setiing said output value in n time as a value of a metastable state, when said output value in said n time is changed from said output value in (n−1) time;
   wherein said step (a) includes:
   (a1) when said asynchronous circuit includes a plurality of sequential circuits which are connected to a same net, separating said net for each of said plurality of sequential circuits, and
   (a2) carrying out said function simulation of a first asynchronous circuit including a separated sequential circuit, which is included in said plurality of sequential circuits and connected to said separated net,
   wherein said step (b) includes:
   (b1) monitoring said output value from said output node of said separated sequential circuit every unit time, and setting said output value of said separated sequential circuit in said n time as said value of the metastable state, when said output value of said separated sequential circuit in said n time is changed from said output value in said (n−1) time.

6. The method according to claim 5, wherein said asynchronous circuit includes:
   a first sequential circuit, and
   a second sequential circuit configured to be asynchronous to said first sequential circuit,
   wherein a first output node of said first sequential circuit is connected to an input node of said second sequential circuit,
   wherein said step (b) includes:
   (b2) outputting said first output value to said second sequential circuit.

7. The method according to claim 5, wherein said step (a2) includes:
   (a21) extracting a circuit as said first asynchronous circuit, wherein said circuit has a node through which an output of asynchronous sequential circuit is connected to a next sequential circuit.

8. The method according to claim 5,
   wherein said plurality of sequential circuits further includes:
   a first sequential circuit configured to be asynchronous to said separated sequential circuit, wherein a first output node of said first sequential circuit is connected to an input node of said separated sequential circuit, wherein said step (b) includes:

(b3) outputting said first output value to said separated sequential circuit.

9. An apparatus for verifying an asynchronous circuit, comprising:
a first function simulator configured to carry out a function simulation of an asynchronous circuit based on circuit information of said asynchronous circuit including a sequential circuit stored in a storage device; and
a second function simulator configured to monitor an output value from an output node of said sequential circuit every unit time, and set said output value in n time as a value of a metastable state, when said output value in said n time is changed from said output value in (n−1) time;
wherein when said asynchronous circuit includes a plurality of sequential circuits which are connected to a same net, said first function simulator separates said net for each of said plurality of sequential circuits, and carries out said function simulation of a first asynchronous circuit including a separated sequential circuit, which is included in said plurality of sequential circuits and connected to said separated net, and
wherein said second function simulator monitors said output value from said output node of said separated sequential circuit every unit time, sets said output value of said separated sequential circuit in said n time as said value of the metastable state, when said output value of said separated sequential circuit in said n time is changed from said output value in said (n−1) time.

10. The apparatus according to claim 9, wherein said asynchronous circuit includes:
a first sequential circuit, and
a second sequential circuit configured to be asynchronous to said first sequential circuit,
wherein a first output node of said first sequential circuit is connected to an input node of said second sequential circuit,
wherein said second function simulator outputs said first output value to said second sequential circuit.

11. The apparatus according to claim 9, wherein said step (a2) includes: (a21) extracting a circuit as said first asynchronous circuit, wherein said circuit has a node through which an output of asynchronous sequential circuit is connected to a next sequential circuit.

12. The apparatus according to claim 9,
wherein said plurality of sequential circuits further includes:
a first sequential circuit configured to be asynchronous to said separated sequential circuit, wherein a first output node of said first sequential circuit is connected to an input node of said separated sequential circuit,
wherein said second function simulator outputs said first output value to said separated sequential circuit.

* * * * *